United States Patent [19]

Heinle

[11] Patent Number: 4,460,537
[45] Date of Patent: Jul. 17, 1984

[54] SLOT TRANSFER MOLDING APPARATUS AND METHODS

[75] Inventor: Preston J. Heinle, Phoenix, Ariz.

[73] Assignee: Motorola, Inc., Schaumburg, Ill.

[21] Appl. No.: 401,575

[22] Filed: Jul. 26, 1982

[51] Int. Cl.³ ............................................. B29F 1/10
[52] U.S. Cl. .............................. 264/272.17; 29/588; 264/272.14; 264/297.1; 425/116; 425/544
[58] Field of Search ................... 264/272.17, 272.15, 264/272.14, 328.4, 328.5, 297; 425/116, 544; 29/588

[56] References Cited

U.S. PATENT DOCUMENTS

| | | | |
|---|---|---|---|
| 3,413,713 | 12/1968 | Heida et al. | 29/588 |
| 3,471,900 | 10/1969 | Burns | 264/272.11 |
| 3,530,541 | 9/1970 | Burns | 264/272.11 |
| 3,685,784 | 8/1972 | Spanjer | 249/110 |
| 3,793,714 | 2/1974 | Bylander | 29/588 |
| 4,347,211 | 8/1982 | Bandoh | 264/328.9 |
| 4,386,898 | 6/1983 | Sera | 264/328.4 |
| 4,388,265 | 6/1983 | Bandoh | 425/544 |

OTHER PUBLICATIONS

P. Burggraaf, "Successful Encapsulation: Molds and Presses," Semiconductor International, Dec. '80, pp. 29-44.

Primary Examiner—Donald E. Czaja
Assistant Examiner—Mary A. Becker
Attorney, Agent, or Firm—Robert M. Handy

[57] ABSTRACT

An improved means and method is provided for encapsulating electronic devices and other objects by transfer molding. The mold cavities are arranged in rows, disposed adjacent to and parallel with slot-shaped encapsulant reservoirs, and coupled to the reservoirs by short feeder channels of uniform length. Preferably, a row of cavities is located in a mirror symmetric fashion on either side of and parallel with each slot-shaped reservoir. A tightly fitting blade moves in each slot-shaped reservoir to compress and liquify the plastic encapsulant charge, injecting it into the mold cavities containing the component to be encapsulated. Plastic utilization can exceed 90%, and better control over molding conditions can be obtained because the plastic material reaches each mold cavity at the same stage of the liquification-solidification cycle. More cavities can be fitted in a given mold area because the usual central material pot and runner-tree are eliminated.

19 Claims, 9 Drawing Figures

FIG. 1 — PRIOR ART —

SLOT TRANSFER MOLDING APPARATUS AND METHODS

BACKGROUND OF THE INVENTION

1. Field of the Invention

This invention relates in general, to improved techniques for encapsulating objects, such as electronic devices and components and, more particularly, to improved means and methods for plastic encapsulation of semiconductor or other electronic devices.

2. Background Art

Plastic encapsulation of semiconductor devices by transfer molding is a well-known and much-used technique. In a typical situation, a large number of components or devices are placed in an open multi-cavity mold, one or more devices in each cavity. For manufacturing convenience the devices are often coupled, that is, ganged together on ladder-like lead frames or tapes. When the mold is closed the two mold portions, usually called "platens" or "halves", seal against the lead frames or tapes to prevent the leads from being covered by plastic. The many cavities in the mold are connected by a tree-like array of channels (runners) to a central reservoir (pot) from which the plastic is fed. Usually, "gates", that is, constricted channel regions, are placed just at the entrance to each cavity to control the flow and injection velocity of the plastic into the cavity, and to permit easier removal from the finished part of the material which has solidified in the runners.

Typically, powdered or pelletized plastic is placed in the central reservoir (pot) and compressed by a ram. The mold and reservoir are usually hot. The combination of heat and pressure causes the plastic to liquify and flow through the runner-tree and gates into the individual mold cavities, where it subsequently hardens.

The mold halves are then separated, and the encapsulated parts are removed and trimmed of excess plastic left in the runners and the gates. When a single mold is used to encapsulate hundreds or thousands of small parts in a single shot, as is common with electronic components, the volume of plastic which remains in the cull, runners, and gates is substantial, and can amount to fifty percent or more of the total volume of plastic material injected into the mold. This residual plastic in the runners and gates is waste material, since in most cases, once the plastic has set-up, it undergoes chemical changes which prevent it from being recycled and re-used. If less than a full load of devices or components is to be encapsulated, a full charge of plastic must still be used since the runner-tree connects to all cavities. This increases the unit cost of encapsulating partial loads.

Prior art attempts to eliminate the runner-tree waste generally have used one of two approaches, (a) eliminating the need for a runner-tree by placing the charge of plastic material directly in each cavity, or (b) arranging for the mold cavities to be in series.

The first of these approaches suffers from the disadvantage that the pressures required to liquify and/or shape the plastic charge directly in the mold cavity are so high that the objects being encapsulated are frequently damaged. Electronic components and devices are particularly susceptible to damage since they usually contain fragile elements, such as small connecting wires or easily damaged semiconductor die. In general, to encapsulate electronic devices it is preferred that the plastic be liquified external to the cavity containing the component and then injected at a controlled velocity into the cavity before it hardens i.e. sets-up.

The second approach suffers from the disadvantage that with serially arranged cavities the material intended for the last cavity must pass through all preceding cavities. Since the working lifetime of most transfer molding materials is relatively short, the flow rate through the cavities must be quite high. This again exposes the electronic components placed within the cavities to damage from the rapidly moving plastic material. For any given material, there is a limited number of serially arranged cavities through which the liquid plastic can be forced prior to set-up. Sometimes, moveable gates are used within the mold to improve transfer of the plastic into the mold cavities, but this significantly increases the complexity and cost of the mold without necessarily decreasing the amount of mold compound required to be used.

Thus, a need continues to exist for improved molding means and methods whereby the waste of molding material is reduced and the plastic utilization efficiency is increased, without constraining the potential number of mold cavities per mold or requiring moveable gates.

Accordingly, it is an object of the present invention to provide an improved mold design for electronic components wherein plastic utilization efficiency is increased.

It is a further object of the present invention to provide an improved mold design for electronic components wherein the plastic utilization efficiency is increased by eliminating the central plastic reservoir and runner-tree structure used in the prior art, and without having to load plastic directly into each cavity or arrange many cavities in a serial fashion.

It is an additional object of the present invention to achieve the above-described objects without requiring moveable mold gates.

It is a further object of the present invention to provide an improved mold design for electronic components wherein the central plastic reservoir and runner-tree structure used in the prior art are eliminated while still permitting liquification of the plastic and control of the injection velocity into the mold cavities.

It is an additional object of the present invention to provide an improved process for encapsulating electronic components and the like.

It is a still further object of the present invention to provide an improved process for encapsulating electronic components utilizing the features of the improved mold design of the present invention.

SUMMARY OF THE INVENTION

Attainment of the foregoing and other objectives and advantages is achieved through the present invention wherein there is provided: a mold having therein a multiplicity of independent mold cavities arranged substantially in one or more rows, parallel with and adjacent to one or more slot-shaped reservoirs in the mold. Each mold cavity is connected to the adjacent slot by a short channel, usually one channel per mold cavity but sometimes more. Closely fitting blades are arranged to engage the slots and act as rams to compress and liquify the plastic charge placed in the slots. The blades are mounted on a transfer plate which can be moved toward or away from the mold. When the blades are fully engaged, the blades substantially fill the slots. When fully retracted, there is space within the slots adapted to receive a plastic charge. It is desirable that the volume of the channels be less than 10-20% of the net volume of the mold cavities, i.e. the mold cavity volume when empty less the volume of the component being encapsulated. It is also desirable that the channels leading from the slot to each mold cavity be of substantially equal length. Where more than one row of mold cavities is used, it is preferable that the rows be arranged in parallel mirror symmetric pairs around the reservoir slot feeding the cavities. A mold can contain a multiplicity of slots and adjacent parallel rows of cavities.

A method is provided for molding parts or encapsulating electronic components or devices in a mold, comprising: providing a mold having the above-described features and consisting of two or more platens one of which has a slot-shaped reservoir; providing one or more blades, at least one per slot, adapted to moveably engage and fill the slots; optionally placing components or other objects to be encapsulated in first half-mold cavities of a first platen; placing a second mold platen facing the first mold platen, so that when the mold is closed the first and second half-mold cavities match to form mold cavities surrounding the optional components or objects; placing in the slots, either before or after closing the mold, a predetermined volume of plastic material at least sufficient to fill the net volume of the mold cavities plus the volume of the short channels connecting the slots to the cavities; advancing the blades in the slots so as to form a substantially closed space within each slot containing the plastic material; moving the blades to compress the plastic material at a predetermined rate, liquifing and forcing the plastic material through the channels and into the mold cavities surrounding the optional components or objects at a predetermined injection velocity; continuing until the blades substantially fill the slots, forcing substantially all the plastic material into the channels and mold cavities to mold the parts or encapsulate the electronic components or objects; and thereafter retracting the blades, separating the first and second mold platens, and removing the molded parts or the encapsulated electronic components or objects. It is preferable that plastic injection occur substantially simultaneously in each mold cavity. It is desirable that the channel volume be not more than 10-20% of the net cavity volume and that the volume of plastic material placed in the mold be not more than 1.1-1.2 times the net volume of the cavity spaces. Removeable mold plates can also be used.

DETAILED DESCRIPTION OF THE DRAWINGS

Figure 1:
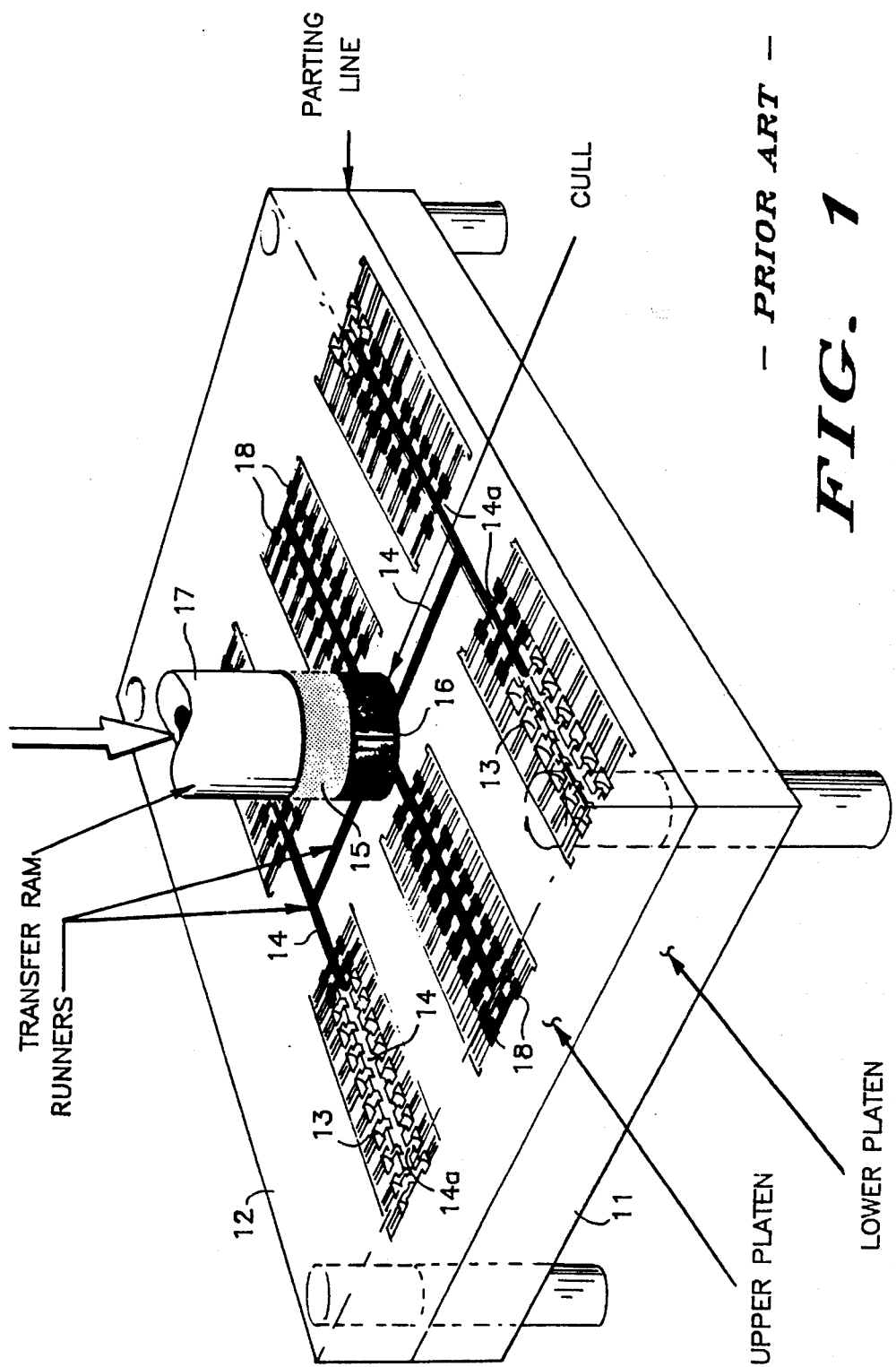
FIG. 1 shows, in schematic form, a top transfer mold for encapsulating multiple electronic components according to the prior art.

FIG. 1 shows a prior art transfer mold for plastic encapsulation of electronic devices, comprising separable lower platen 11 and upper platen 12, in which are formed mold cavities 13 adapted to contain unencapsulated devices, a "tree"-like pattern of runners 14 with gates 14a and a central plastic reservoir or pot 15. Hot plastic 16 in pellet form is placed in pot 15 and compressed by moveable ram 17 causing plastic 16 to liquify and flow through runners 14 and gates 14a into mold cavities 13 to form encapsulated devices 18. A defect of this prior art mold design and method is that often, only about fifty percent of plastic 16 ends up encapsulating devices 18. The rest is wasted filling runners 14 and gates 14a or remains as a cull in pot 15. This wasted material cannot be reused, because during set up, the plastic undergoes chemical changes and will no longer liquify.

Figure 2:
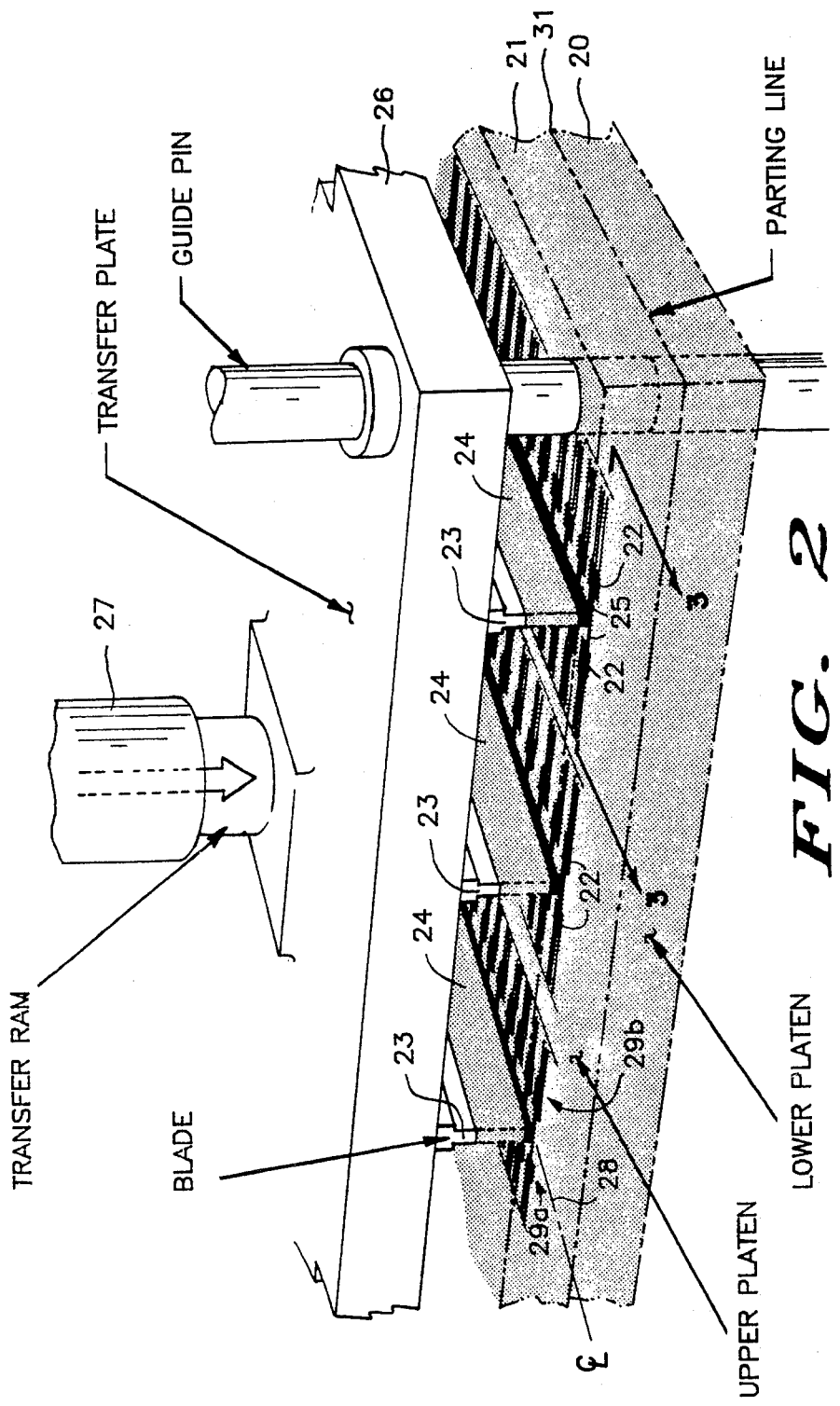
FIG. 2 shows, in schematic form, a top transfer mold for encapsulating multiple electronic components according to the present invention.
Figure 3:
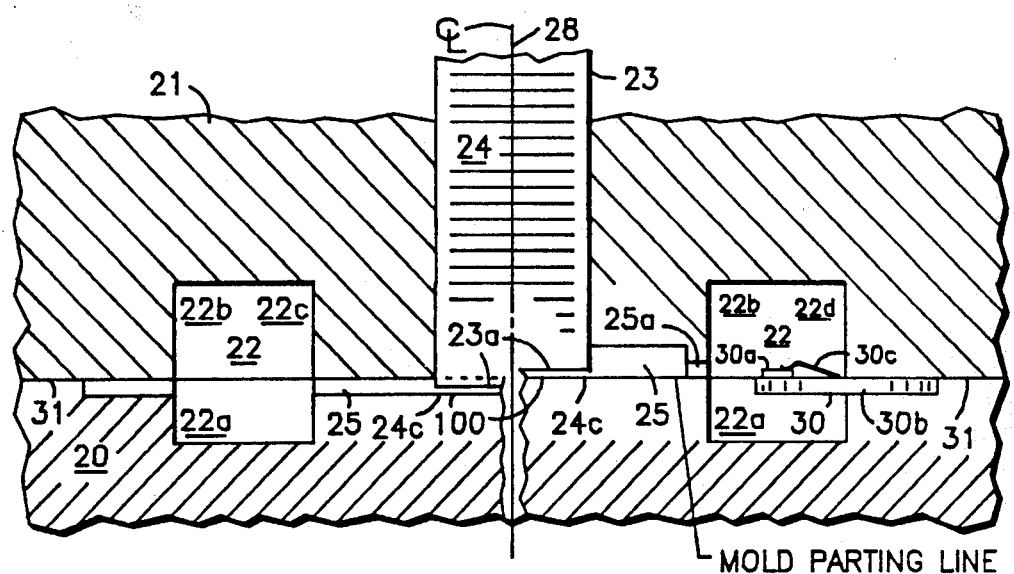
FIG. 3 shows a simplified and enlarged cross section of a typical pair of mold cavities of FIG. 2.

FIG. 2 shows in simplified form a preferred embodiment of the mold of the present invention, comprising lower platen 20 and upper platen 21 in which are formed mold cavities 22 adapted to contain unencapsulated devices. FIG. 3 shows a simplified and enlarged cross section of a typical pair of mold cavities of FIG. 2. Mold cavities 22 are comprised of lower half-mold cavities 22a located in lower platen 20 and upper half-mold cavities 22b located in upper platen 21. It will be recognized by those of skill in the art that the designation "half-mold" does not imply that precisely fifty percent of the total mold cavity must be located in each platen, but only that the final mold cavity must be in two separable parts, so that the mold may be opened in order that electronic component 30 may be placed within mold cavity space 22, if desired, and so that the finished device may be removed after encapsulation. If for example, the shape to be molded is in the form of a half-cylinder, then substantially the entire mold cavity can be in one platen with the other platen being substantially flat. For any given shape, the proportion of mold cavities 22 and runners 25 to be located in each platen is a matter of choice by the designer based on principles well known in the art. As used herein the words "upper platen" and "lower platen" or "first mold platen" and "second mold platen" refer to the two separable portions of the mold used to define the enclosed mold cavities in which molding is to occur. The words "upper" and "lower" are used for ease of description and do not imply a required orientation in space, since the molds may be readily designed to operate in either top transfer (ram on top) or bottom transfer (ram on bottom) configurations without affecting their basic function.

The mating faces of the two mold portions 20-21 form mold parting line 31. FIG. 3 shows an enlarged cross-section through a pair of mold cavities 22, channels 25 and a slot 24 of FIG. 2. Electronic component 30 having semiconductor die 30a, external lead 30b, and wire 30c is illustrated in mold cavity 22d in the right half of FIG. 3. For clarity component 30 has been omitted from cavity 22c in the left half of FIG. 3. Well known mold features such as vents to allow air to escape during plastic injection, and tapered sidewalls and/or ejector pins which facilitate removal of the finished parts are omitted for clarity. Those of skill in the art will recognize that such features may be required in practice.

Instead of a single pot and ram connected to the mold cavities by a tree of runners, as in FIG. 1, there is shown in FIG. 2, according to the present invention, a multiplicity of rams in the form of blades 23, descending into a multiplicity of pots 24 in the shape of slots. Slots 24 which form the plastic reservoirs, are arranged parallel with and next to mold cavities 22 so that the lengths of channels 25 between slots 24 and cavities 22 are minimized (see FIG. 3). In order to accommodate the greatest number of cavities, it is desirable to arrange mold cavities 22 in parallel rows 29a–b, mirror symmetric about center line 28 lying between rows 29a–b, and locate slots 24 along mirror image centerlines 28. The length of parallel rows 29a–b and slots 24 are conveniently approximately the same. Gates 25a, one of which is illustrated in the right half of FIG 3, can be provided in channels 25 at the entrance of each mold cavity in order to assist in regulating the velocity of plastic flow into mold cavity 22. However since channels 25 are so short, they can be used to perform the gating function directly, and separate gates can be omitted. This arrangement is shown in the left half of FIG. 3.

The electronic parts to be encapsulated may be individual parts placed in the half-mold cavities one at a time, or more typically may be mounted on a "ladder"-like lead frame or tape, each rung corresponding to an individual device. In this way the devices may be conveniently handled in large numbers. Such ladder-like lead frames and tapes are commonly used. The words "ladder-like" are intended to include lead frames having only a single spine or rail. The slot shape of reservoirs 24 and their location parallel with and adjacent to linear row 29a and/or 29b of cavities 22 is particularly convenient for encapsulating ladder lead frame or tape supported device arrangements. Placing slots 24 on center lines 28 between mirror symmetric rows 29a–b gives improved packing density in the mold.

Blades 23 are dimensioned so as to provide a close fit in slots 24 so that, as they descend into slots 24, the plastic contained within slots 24 is forced into the channels and mold cavities rather than escaping between blades 23 and slots 24. Blades 23 are conveniently attached to transfer plate 26 actuated by ram 27. Transfer plate 26 is moveably coupled to upper mold platen 21 and holds blades 23 in alignment so as to engage slots 24. While use of a single transfer plate 26 is convenient, individual rams could be used to move blades 23 in slots 24.

Figure 4A:
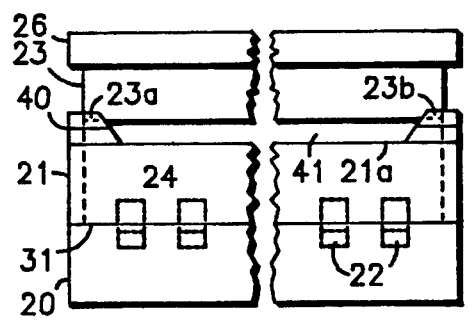
FIGS. 4A-B are, respectively, a side view and partial end view, in simplified form, of a mold and blade shaped ram arrangement according to the present invention.
Figure 4B:
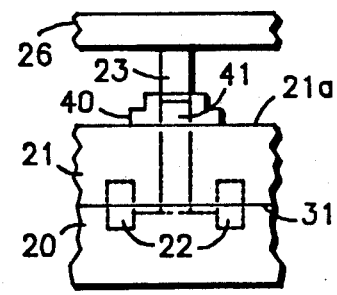

In order to maintain blades 23 in alignment with slots 24 it is desirable to provide blade guides 40 as illustrated in FIGS. 4A–B. FIG. 4A is a side view and FIG. 4B a partial end view, both in simplified form, of lower platen 20 and upper platen 21 having mold cavities 22 and one or more slots 24. Transfer plate 26 and blade 23 have been retracted to provide space 41 between blades 23 and platen 21. This space provides access so that plastic material may be introduced into slot 24. Blade guides 40 mounted on exterior surface 21a of platen 21 and in alignment with slot 24, retain corners 23a–b of blade 23 so that blade 23 remains in alignment with slot 24 when retracted.

As shown in FIG. 3, when transfer ram 27 and transfer plate 26 are in their lowest position, blade 23 substantially fills and fully engages slot 24 so that almost no plastic material remains in slot 24. FIG. 3 illustrates the situation where blade 23 is fully engaged in slot 24. It is desirable that small gap 100 be left between bottom face 23a of blade 23 and bottom face 24c of slot 24. Gap 100 can be as small as 0.05 mm although somewhat larger values, for example, 0.25 mm, are more convenient. Gap 100 is important because it permits the plastic remaining therein to transmit the force of ram blade 23 hydrostatically to the plastic in channels 25 and cavities 22. Because gap 100 is small and channels 25 are so short, plastic utilization can be better than 80–90%, depending upon the cavity size. This is a significant saving over the prior art.

In its simplest embodiment, a mold according to the present invention consists of a single row of cavities coupled by short channels to a single slot shaped reservoir adjacent to and parallel with the row of mold cavities. A blade shaped ram fits into the single slot-shaped reservoir to liquify and transfer the plastic from the reservoir through the short channels so that it can reach all cavities, preferably, in substantially the same time. This arrangement is illustrated by cutting the mold of FIG. 3 on the centerline and using either the left or right half i.e. having only one row of cavities with the slot and blade. As will be discussed later, this arrangement is particularly useful in automated manufacturing lines where a ladder-like lead frame, tape supported lead frame, or equivalent moves in a linear fashion through successive assembly and encapsulation stations.

In a general purpose mold, better space utilization within the mold is obtained by having two rows of cavities arranged in a mirror symmetric parallel fashion on either side of a single reservoir slot. In this arrangement the single reservoir slot and ram blade feed plastic to both rows of cavities through connecting channels which can all be arranged to be short and of substantially equal length. Thus the pair of mirror symmetric rows possess all the advantages of a single row, plus better packing density since they share a common reservoir slot and ram blade. This arrangement is illustrated by cutting the mold of FIG. 2 to include only one slot, one blade, and a pair of rows of cavities.

More complicated molds are made by using multiple reservoir slots and ram blades each coupled to one or more parallel closel spaced rows of cavities. FIG. 2 illustrates a mold having multiple slots and multiple pairs of cavity rows. Pairs of cavity rows, while desirable, are not mandatory.

More than two rows of cavities can be fed from a single reservoir, for example, by locating a third and fourth row parallel to and outbound from the first and second parallel mirror symmetric rows, and with the channels feeding the cavities of rows three and four passing around the cavities of rows one and two. While each cavity in a given row can have a channel of equal lengthh relative to another cavity in the same or an equivalently located row, the channel lengths to rows three and four will be longer than the channel lengths to rows one and two. Alternatively each cavity of rows three and four could be placed in series with the adjacent cavity of rows one and two.

A mold according to the present invention, and possessing more than one slot and associated row or rows of cavities, can be operated with a partial load of components without loss of molding efficiency or increased material waste. This is a particular feature of the present invention which is unlike the prior art. For example, using a mold of the type illustrated in FIG. 2, partial loads of one-third or two-thirds of capacity may be encapsulated using only enough plastic for those components. This is accomplished by placing the partial load of components adjacent a single slot and putting plastic only in that slot. Since no plastic is loaded in the other slots associated with cavities which have not received components, no material is wasted. This capability is not possessed by the single pot and runner-tree or serial configuration of the prior art.

The following is an example of the practice of the method of the present invention. For convenience in describing the method, the mold configuration illustrated in FIGS. 2 and 3 is assumed. Those of skill in the art will recognize that other embodiments of the present invention are also suitable. Lower platen or mold portion 20 is placed in a mold press and electronic components 30 are placed in lower half-mold cavities 22a. Upper platen or mold portion 21 is aligned over lower platen 22 so that upper half-mold cavities 22b and lower half-mold cavities 22a mate to form, surrounding electronic components 30, mold cavities 22 desired to be injected with plastic. Slots 24 and short connecting channels 25, as previously described, must be provided. Transfer ram 27 with transfer plate 26 carrying blades 23 is placed above upper platen 21 and blades 23 aligned with slots 24. A predetermined volume of plastic material, at least sufficient to fill the net volume of mold cavities 22 plus channels 25 (including optional gates 25a) and gap 100, is placed in slots 24. The plastic loading operation can be performed any time following mold closure and prior to insertion of blades 23 in slots 24. The net cavity volume of the mold cavities is the empty mold cavities volume less the volume occupied by the electronic components, and corresponds substantially to the volume of plastic encapsulant desired around the components in the finished devices.

Following insertion of the plastic molding material in slots 24, blades 23 are inserted in slots 24 and moved toward lower platen 20 so as to compress the plastic material. It is convenient that the mold be maintained at an elevated temperature (i.e. 150° to 200° C.) in order to more readily liquify the plastic material and control its flow and solidification time. Epoxy compounds manufactured by the Hysol Division of the Dexter Corporation, Olean, N.Y., are typical plastic materials suitable for transfer molding in this temperature range.

When compressed by blades 23, the plastic material in slots 24 liquifies and flows through channels 25 and optional gates 25a into mold cavities 22. It is important that the velocity at which the liquid plastic material is injected into mold cavities 22 be controlled so as not to exceed a maximum injection velocity. The limit on maximum injection velocity is required in order to avoid forming voids in the plastic or having the rapidly moving plastic damage fragile elements of the electronic component, such as, inter-connection wires 30c or semiconductor chips 30a. The maximum injection velocity may be readily determined by experiment. It is also important that the injection molding time be less than the solidification time. This second requirement imposes a lower limit upon the injection velocity. The solidification time of injection molding compounds can be determined by methods well known in the art.

Following injection of the plastic material into mold cavities 22, blades 23 are desirably maintained engaged in slots 24 for a predetermined plastic cure time in order that encapsulation may be completed. The proper cure time may be readily determined for each molding material. Thereafter, blades 23 are retracted, upper and low mold platens or portions 21 and 20 are separated, and the encapsulated devices removed from the mold.

It will be apparent from FIGS. 2 and 3 and the associated description, that moveable gates are not required in the mold and method of the present invention. This is an advantage in that it significantly reduces the complexity of the mold and the procedures required to operate the mold. A high plastic utilization efficiency is obtained by controlling the location and dimensions of channels 25 relative to mold cavities 22 so that channel volume is a small fraction of the net cavity volume. This is easily accomplished with the configuration of the present invention since slot-shaped reservoirs 24 can be brought into immediate proximity with the parallel rows of mold cavities 22. It will also be apparent by a comparison of FIG. 1 and FIG. 2 that a larger number of mold cavities can be accommodated within a given exterior mold dimension since the runner-tree occupying the central portion of the mold of FIG. 1 is not required in the present invention, as illustrated, for example, in FIG. 2. These advantages are obtained without placing any mold cavities in series, although this could be done if desired.

The closely spaced, parallel, arrangement of slots 24 and mold cavity spaces 22 is a significant advantage. Slots 24 are the reservoirs for the plastic molding material. Channels 25 connecting slots 24 to cavity spaces 22 are short and can all be substantially of the same length. The desirability of these features is related to the properties of the encapsulation material and methods used for transfer molding.

In transfer molding, the encapsulation material is placed in the mold as a solid and is changed by heat and pressure, applied within the mold, into a liquid which is injected into the mold cavities. It then gels or sets-up, effectively returning to a solid. The available injection time is limited by the duration of the liquid phase which is very short, typically 10-100 seconds. The shorter the channels between the reservoir and the mold cavity space, the lower the injection velocity which can be used. This is an advantage since it reduces the probability that the moving plastic entering mold cavities 22 will damage fragile elements on electronic device 30. With the configuration of the present invention, the length of channel 25 between reservoir 24 and mold cavity 22 can be minimized. Thus, lower injection velocities can be obtained compared to the prior art.

The fact that channels 25 between reservoir slots 24 and cavities 22 can all be of substantially equal length is an advantage since this means that the liquid plastic reaches each cavity at substantially the same time after the compression-liquification-solidification cycle begins. This is important because the physical properties of many desirable plastic molding materials vary rapidly with time during the molding process. Since the time is the same, the properties of the plastic entering all cavities is substantially the same, and thus molding conditions, such as pressure, temperature, injection velocity, gel time, and the like can be optimized more easily and for a wider variety of molding materials. Superior results can thus be obtained. With prior art arrangements, as in FIG. 1 or with serially arranged cavities, the plastic reaching the first cavity, close to the central reservoir, can be at a markedly different stage of the liquification-solidification sequence than the plastic reaching the last cavity further out the "runner-tree." Thus, with prior art arrangements, mold cavity injection at uniform viscosity and flow velocity is almost impossible to obtain. This deficiency is avoided by the present invention and encapsulation uniformity is improved.

Figure 5:
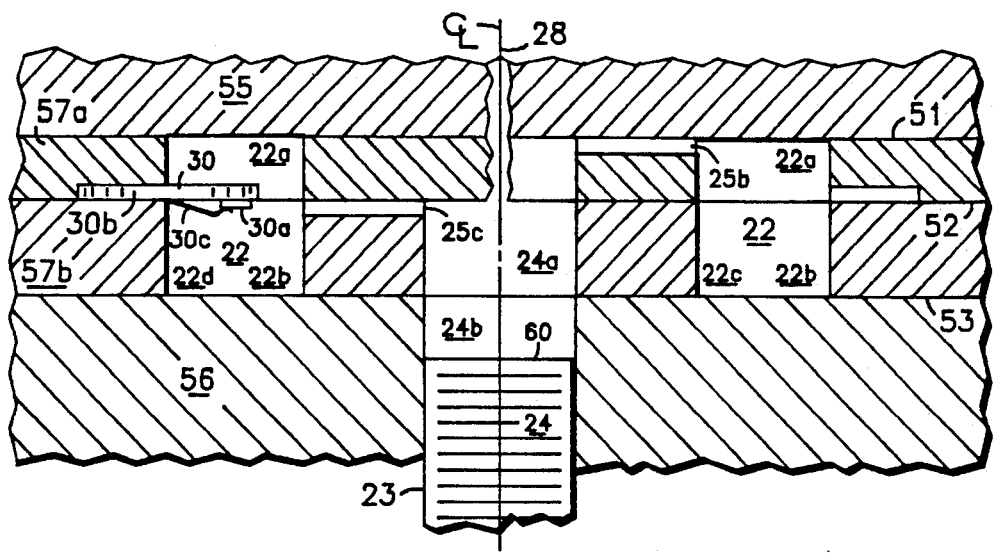
FIG. 5 shows a simplified and enlarged cross section of a typical pair of mold cavities of a bottom transfer mold according to a further embodiment of the present invention.

FIG. 5 shows a simplified and enlarged cross section of a typical pair of mold cavities, similar to FIG. 3 but with the blade located in the lower mold half (bottom transfer mold), and illustrating a further embodiment of the present invention. The mold portion of FIG. 5 has multiple mold parting lines 51-53. Upper mold platen 55 and lower mold platen 56 are substantially planar and mold cavities 22 are contained within removeable mold plates 57a-b. Upper and lower mold halves 55 and 56 separate on parting lines 51 and 53 respectively. Mold plates 57a-b separate on parting line 52. In practice, components 30, as shown in cavity 22d in the left of FIG. 5, are loaded into mold plate 57a which is then assembled with mold plate 57b. Assembled mold plates 57a-b are then placed between platens 55-56 such that slot 24a of mold plates 57a-b aligns with slot 24b in platen 56. Blade 23 is shown in a partly inserted position. FIG. 5 also illustrates alternative placements of channels 25a-b connecting cavities 22 to slot 24. In the left half of FIG. 5, mold cavity 22d is connected to slot 24a-b by channel 25c formed in lower mold plate 57b. In the right half of FIG. 5, mold cavity 22c is connected to slot 24a-b by channel 25b formed in upper mold plate 57a. Many variations of platen and mold plate design are possible utilizing the features of the present invention. For example, mold parting line 53 may be eliminated by forming lower half-mold cavities 22b as a part of lower platen 56. Further, channels 25a-b may be located in either platen or either mold plate or a combination thereof. Additionally, depending upon the shape of the object being molded, cavity 22 may be split into portions 22a-b located in either upper or lower mold plates and/or mold platens, or a combination thereof, or located entirely within one mold plate or platen.

The present invention has been illustrated for a slot-cavity arrangement wherein the slot lies along the centerline of parallel, mirror symmetric rows of cavities. While this arrangement provides good packing density for a given mold area, it is not essential that there be multiple rows of cavities or multiple slots and blades. Even with a single slot-shaped reservoir and blade, closely coupled by short channels to a single parallel row of cavities, important advantages are obtained, including improved material utilization and uniform transfer time of the plastic molding material. These result in lower unit cost and better quality through more uniform injection and better control of the molding properties. The single slot-single row arrangement is particularly desirable where ladder-like or other serial types of lead frames or tapes are being fed into the mold automatically in an assembly line type of arrangement.

Figure 6:
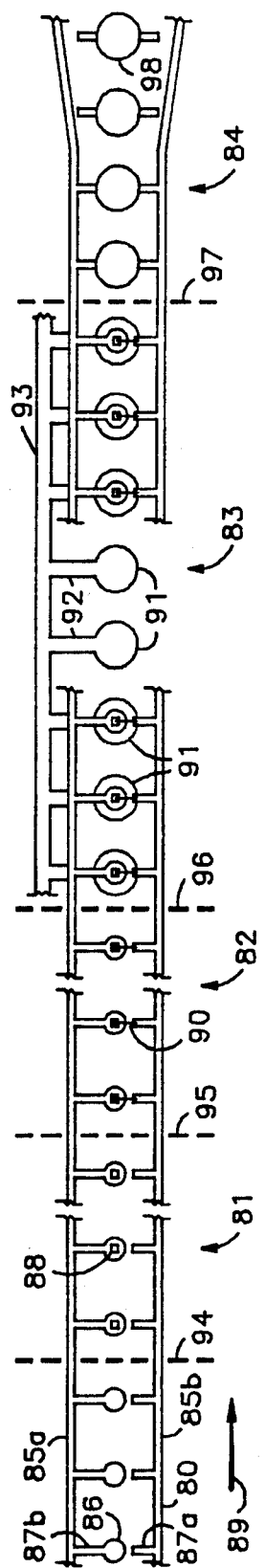
FIG. 6 shows in schematic and simplified form, a component assembly and molding line using a further embodiment of the present invention.

An automated assembly and molding line is illustrated schematically in FIG. 6 wherein ladder lead frame 80 passes successively through die attach station 81, lead bond station 82, molding station 83, and lead clip station 84. Ladder lead frame 80 has circular bonding pads 86, lead portions 87a-b and side rails 85a-b. Cross-members (not shown) extending between rails 85a-b or a supporting tape hold rails 85a-b in relative position. Such lead frames or tapes, of which this is but a simplified illustration, are well known in the art. Lead frame 80 can be continuous or in segments, and while a ladder lead frame or tape is particularly convenient, any serially connected and/or strp lead frame can be used.

Lead frame 80 moves in the direction of arrow 89 into die attach station 81 where die 88 are attached to bonding pads 86 by means well known in the art. Lead frame 80 then advances to lead bond station 82 where lead wire 90 is bonded between die 88 and lead 87a by means well known in the art. Lead frame 80 then advances to molding station 83, which in this example is illustrated as having eight mold cavities 91. The upper mold platen has been removed and a portion of the lead frame has been omitted in molding section 83 so that cavities 91, channels 92, and reservoir slot 93 can be easily seen. Channels 92 connect cavities 91 to reservoir slot 93. The parallel, closely spaced relationship between mold cavities 91 and slot-shaped reservoir 93 is particularly convenient for quasi-continuous molding of components which are tied together in a linear arrangement, as on a ladder-like lead frame, tape, or the like. Molding is quasi-continuous in that lead frame 80 is advanced into and removed from mold station 83 in increments determined by the number N of cavities in the mold. For example, in FIG. 6, N=8, hence the components would be moved and molded eight at a time in station 83. While it is possible to operate the entire assembly line by moving lead frame 80 in N-fold increments, greater efficiency can be obtained by providing take-up reels or cassettes at one or more of interfaces 94-97 between stations 81-84. This allows each station to advance lead frame 80 in different increments. Take up reel or cassette arrangements are well known in the art. After molding is completed, lead frame 80 is advanced into lead clip station 84 where side rails 85a-b are sheared off so that separate encapsulated components 98 are obtained.

It will be apparent to those of skill in the art that the present invention provides an improved transfer molding means and method for molding of parts and for encapsulation of electronic components and other objects. The invented means substantially increases plastic material utilization by reducing the material waste associated with a central material reservoir and a runner-tree leading from the central reservoir to the individual mold cavity spaces. Further, the resent invention does not require a serial arrangement of mold cavity spaces and/or the use of moveable gates within the mold, nor does it require that the plastic material be placed directly in the mold cavity spaces. These advantages are provided by use of slot shaped material reservoirs which are located parallel to and in close proximity to a linear array of mold cavities, preferably along the center lines of and closely coupled to parallel, mirror symmetric, arrays of mold cavities. The invented mold configuration also provides more uniform and flexible control over molding conditions.

There is further provided an improved molding method, taking advantage of the blade and slot shaped reservoir combination located parallel with and in close proximity to a linear array of mold cavities, preferably in a closely spaced, mirror symmetric, and parallel relationship, so that molding material waste is substantially reduced. Improved control over the molding process is exercised by injecting the encapsulant substantially simultaneously into the individual mold cavity spaces.

While the present invention has been described in terms of particular materials and devices, it will be apparent to those of skill in the art that these concepts apply to a wide range of devices, materials, mold configurations, and mold cavity shapes. For example, the terms "upper" and "lower" have been used to describe various parts of the mold platens, plates, blades, channels and cavities. These terms are not intended to require that the molds be used only in specific directions or up and down relationships, although one arrangement may be more convenient than another. Those of skill in the art will appreciate that the orientation of the upper and lower parts may be reversed without altering the features of the present invention. The molds of FIGS. 2-4 can be inverted so that the platen containing blades 23 is now the lower platen. This is illustrated in FIG. 5 wherein platen 56 is at the bottom and platen 55 at the top of the mold. One advantage of this arrangement is that blade 23 need not be removed from slot 24 in order to load the plastic material and the plastic can be placed in slot 24 while the mold is still open. With the mold of FIG. 5 open along parting line 53, plastic material may be placed directly on face 60 of blade 23 in slot portion 24b where it will remain by gravity. This simplifies mold construction and use.

Figures 7A, 7B:
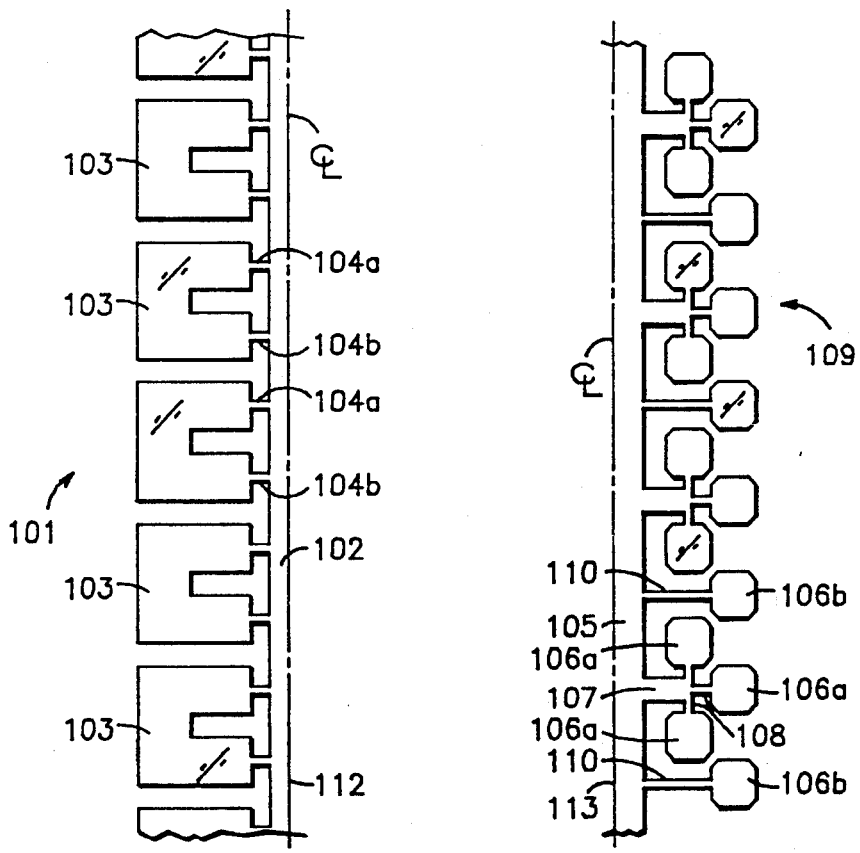
FIGS. 7A-B are top views in simplified form and with the upper platen removed, of a row of mold cavities and associated slot shaped reservoirs, according to alternative embodiments of the present invention.

FIGS. 2-6 have illustrated mold configurations in which there is only one channel per cavity. If desired, more than one channel can be used, as is shown for example, in FIG. 7A where in mold portion 101 has slot 102 and several cavities 103 connected by two equi-length channels 104a-b per cavity. Conversely, a single channel can serve more than one cavity wile still deriving many of the important benefits of the present invention. For example, FIG. 7B shows mold portion 109 having slot 105 connected to several cavities 106a by channels 107 including gates 108, and to several cavities 106b by integral channel-gate 110. Channel and gate lengths 107-108 and 110 can be equal so that the injected material arrives in all cavities substantially at the same time after compression. FIG. 7A is mirror symmetric about centerline 112 and FIG. 7B about centerline 113.

While the present invention is particularly well adapted to encapsulation of electronic components, other objects may also be encapsulated. Further, the present invention is generally useful for transfer molding of parts and objects, not just for encapsulation alone. For example, a variety of small plastic parts can be advantageously molded using the improved means and method of the present invention.

Many other variations are possible. Accordingly, it is intended to encompass all such variations as fall within the spirit and scope of the present invention.

I claim:

1. A mold for encapsulating a plurality of objects, comprising:
    separable mold portions having therein a plurality of mold cavities adapted to contain said objects, arranged in at least one row;
    a slot-shaped reservoir for receiving encapsulant, formed in one of said separable mold portions, and aligned parallel with and adjacent to said at least one row;
    channels, at least one per cavity, connecting said cavities to said adjacent slot-shaped reservoir; and
    a blade shaped ram of dimensions to closely fit and moveably engage said slot-shaped reservoir and adapted to compress said encapsulant within said reservoir and inject it into said cavities via said channels.

2. The mold of claim 1 wherein said plurality of mold cavities is arranged in two rows, disposed in mirror symmetric relationship parallel with and on either side of said slot-shaped reservoir.

3. The mold of claim 1 further comprising a plurality of rows of mold cavities and a plurality of slot-shaped reservoirs, each slot-shaped reservoir disposed parallel with and adjacent to at least one of said rows of mold cavities.

4. The mold of claim 3 wherein some of said plurality of rows of mold cavities are arranged in pairs, and wherein each said pair of rows is disposed in mirror symmetric relationship parallel with and on either side of one of said plurality of slot-shaped reservoirs.

5. The mold of claim 1, 2, 3, or 4 wherein said mold is a transfer mold and wherein said channels connecting said plurality of cavities to said adjacent slot are each of lengths so that encapsulant arrives in each cavity at substantially the same time.

6. The mold of claim 5 wherein said lengths of said channels are substantially equal.

7. The mold of claim 1, 2, 3, or 4 wherein said mold is a transfer mold, and wherein each said cavity is adapted to contain one object, and wherein said objects are electrical components mounted on a lead frame.

8. The mold of claim 7 wherein said channels have a channel volume and said mold cavities have a net cavity volume and wherein said channel volume is less than 20% of said net cavity volume.

9. The mold of claim 1, 2, 3, or 4 wherein said slot-shaped reservoirs and said rows of mold cavities are of substantially equal length.

10. The mold of claims 1, 2, 3, or 4 wherein said separable mold portions comprise a first and second mold platen and at least one removeable mold plate, said at least one removeable mold plate has therein at least a portion of each said mold cavity.

11. A transfer mold for forming plastic parts, comprising:
    a first mold portion having a plurality of independent first half-mold cavities arranged substantially in at least one row;
    a second mold portion moveably coupled to said first mold portion, and having a plurality of independent second half-mold cavities adapted to mate with said first half-mold cavities, wherein said first and second half-mold cavities, when combined, define at least one row of mold cavities, and wherein each said mold cavity has a predetermined shape and volume;
    a plurality of slot-shaped reservoirs for plastic penetrating one of said first and second mold portions and aligned substantially parallel with and adjacent to said row of mold cavities;
    a plurality of short channels each of a predetermined shape and volume, at least one channel per mold cavity, connecting each said mold cavity to one of said slot-shaped reservoirs;
    a plurality of blades, at least one per slot-shaped reservoir, adapted to moveably engage said slot-shaped reservoirs, and of a size so as to be able to substantially fill said slot-shaped reservoirs when engaged.

12. The mold of claim 11 further comprising at least two rows of mold cavities disposed in mirror symmetric relationship, parallel with and on either side of one of said slot-shaped reservoirs.

13. A process for encapsulating objects comprising:
    providing a mold having therein a plurality of mold cavities arranged in a row and adapted to contain said objects, and further having a slot-shaped encapsulant reservoir parallel with and adjacent to said row of mold cavities and coupled to said mold cavities by short channels;

then in arbitrary order, placing said objects in said mold cavities and placing said encapsulant in said slot-shaped encapsulant reservoir;

thereafter advancing a blade shaped ram in said slot-shaped reservoir to compress, liquify and transfer said encapsulant from said slot-shaped reservoir into said short channels; and injecting said encapsulant from said short channels into all said mold cavity spaces at substantially the same time.

14. The process of claim 13 further comprising limiting said encapsulant placed in said slot-shaped reservoir to a volume less than 1.2 times a net volume of said mold cavity spaces.

15. A process for encapsulating electronic components, comprising:

loading a plurality of components into at least two rows of mold cavities mirror symmetrically disposed on each side of a slot penetrating a portion of said mold and communicating with said mold cavities by channels;

inserting a predetermined quantity of plastic encapsulant material into said slot; and displacing, by means of at least one blade inserted in said slot, said plastic encapsulant material to arrive substantially simultaneously in said mold cavities.

16. A process for encapsulating electronic components in a mold without moveable gates, comprising:

placing a plurality of components in mirror symmetric rows of mold cavities located on each side of a slot penetrating a portion of said mold and communicating with said mold cavities by substantially equal length channels;

inserting a predetermined quantity of plastic encapsulating material into said slot;

inserting a blade into said slot to displace said plastic, and injecting said plastic substantially simultaneously into all said mold cavities.

17. A process for forming plastic objects of a predetermined shape comprising:

providing a separable transfer mold having cavities therein corresponding substantially to said predetermined shape and symmetrically disposed parallel with and adjacent to a slot-shaped plastic reservoir and connected thereto by short channels;

inserting a predetermined quantity of plastic material suitable for transfer molding into said slot;

liquifying by means of at least one blade shaped ram inserted in said slot, said plastic material;

controlling the flow of said liquified plastic material through said channels so that said plastic material arrives substantially simultaneously in said mold cavities.

18. An assembly and molding line for mounting and encapsulating electronic components on a lead frame, characterized by:

bonding means for attaching said electronic components to a first portion of said lead frame;

molding means for encapsulating said attached electronic components comprising separable mold portions having therein a plurality of mold cavities adapted to contain said attached electronic components, arranged in at least one row, and a slot-shaped reservoir for receiving encapsulant, formed in one of said separable mold portions, and aligned parallel with and adjacent to said at least one row, and channels, at least one per cavity, connecting said cavities to said adjacent slot-shaped reservoir, and a blade shaped ram of dimensions to closely fit and moveably engage said slot-shaped reservoir and adapted to compress said encapsulant within said reservoir and inject it into said cavities via said channels;

detaching means for separating said encapsulated electronic components from a second portion of said lead frame; and advancing means for moving said lead frame successively through said bonding means and molding means, and into said detaching means.

19. The assembly and molding line of claim 18 further comprising between said bonding means and said molding means, lead attach means for connecting at least one terminal region on said component to a third portion of said lead frame.

* * * * *